United States Patent [19]
Tomioka et al.

[11] Patent Number: 5,835,936
[45] Date of Patent: Nov. 10, 1998

[54] SINGLE-CHIP FLASH-MEMORY DEVICE USING SERIAL COMMAND, ADDRESS, AND DATA COMMUNCATIONS

[76] Inventors: Takanori Tomioka; Osamu Ishizaki; Makoto Ohta; Takashi Furumura, all of c/o Mitsubishi Electric Semiconductor Software Co., Ltd., 1-17, Chuo 3-chome,Hyogo 664, Itami, Japan

[21] Appl. No.: 558,792

[22] Filed: Nov. 15, 1995

[30] Foreign Application Priority Data

Jul. 6, 1995 [JP] Japan ............................ 7-170908

[51] Int. Cl.⁶ ..................... G06F 13/16; G11C 16/04
[52] U.S. Cl. ............. 711/103; 365/185.33; 365/219
[58] Field of Search .............. 395/430; 365/185.33, 365/219, 20

[56] References Cited

U.S. PATENT DOCUMENTS 5,297,148  3/1994  Harai et al. .................. 371/10.2
5,430,859  7/1995  Norman et al. .................. 711/103

*Primary Examiner*—Eddie P. Chan
*Assistant Examiner*—Reginald G. Bragdon

[57] ABSTRACT

A one-chip flash-memory device includes a flash-memory array, a communications unit for analyzing a serial signal applied to the communications unit and for resolving the serial signal into an address, a command, and data in parallel with each other, and a control unit for controlling rewriting, erasing, and reading operations of the flash-memory array in accordance with the address, the command, and the data of the serial signal received by the communications unit. Rewriting and erasing operations may be performed without dismounting the flash-memory from a circuit board. In addition, the area of the circuit board on which the flash-memory is mounted is advantageously reduced.

3 Claims, 9 Drawing Sheets

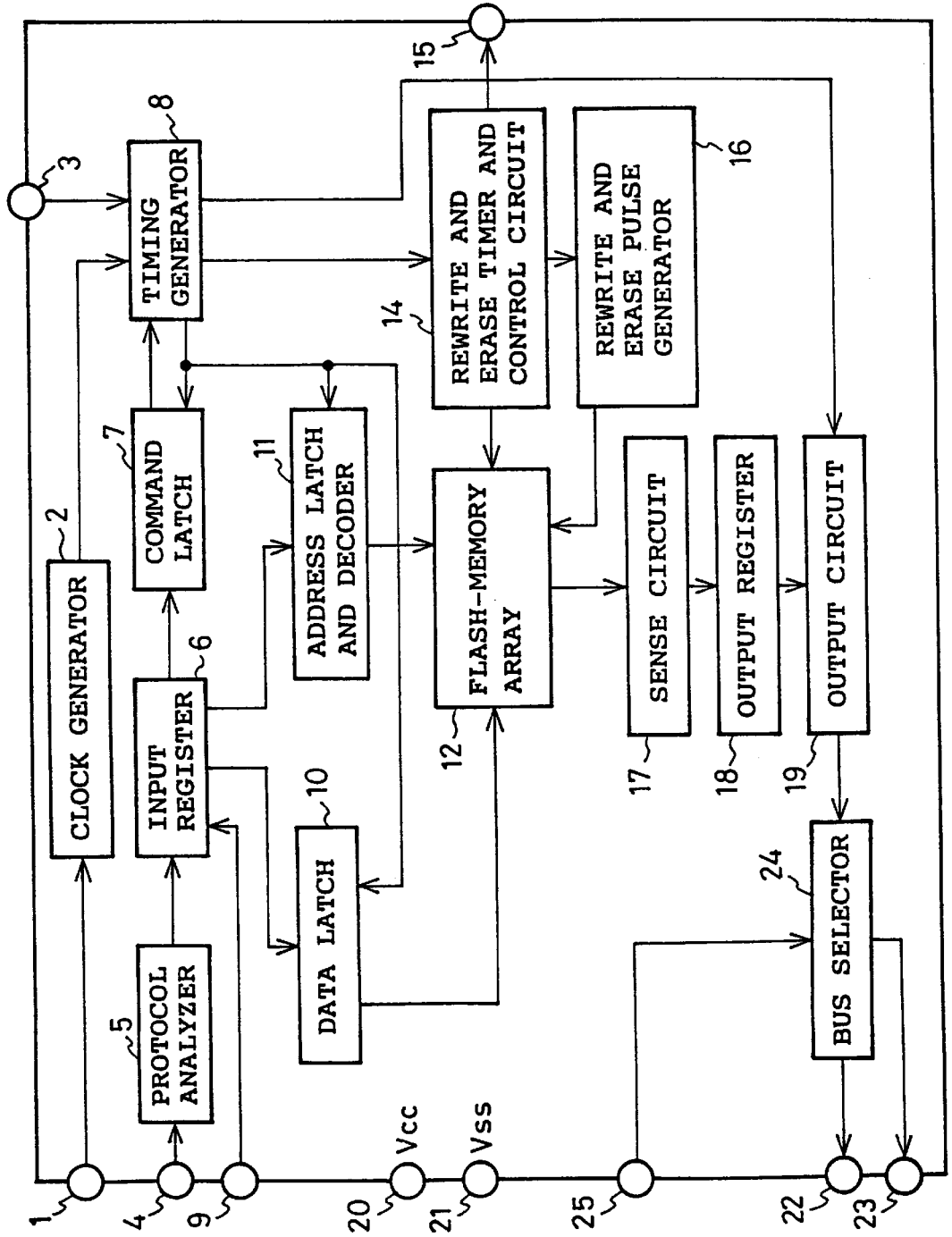

FIG. 2(a) WRITE

PROTOCOL SHOWING THE START OF COMMUNICATIONS | $P_1$---$P_n$ | $C_1$---$C_x$ | $A_1$---$A_y$ | $D_1$---$D_z$ | $P_1$---$P_n$ | $C_1$---$C_x$ | $A_1$---$A_y$ | $D_1$---$D_z$
COMMAND ADDRESS DATA
PROTOCOL SHOWING THE START OF COMMUNICATIONS
COMMAND ADDRESS DATA

FIG. 2(b) ERASE

PROTOCOL SHOWING THE START OF COMMUNICATIONS | $P_1$---$P_n$ | $C_1$---$C_x$ | $P_1$---$P_n$ | $C_1$---$C_x$
COMMAND
PROTOCOL SHOWING THE START OF COMMUNICATIONS
COMMAND

FIG. 2(c) READ OUT

PROTOCOL SHOWING THE START OF COMMUNICATIONS | $P_1$---$P_n$ | $C_1$---$C_x$ | $A_1$---$A_y$ | $P_1$---$P_n$ | $C_1$---$C_x$ | $A_1$---$A_y$
COMMAND ADDRESS
PROTOCOL SHOWING THE START OF COMMUNICATIONS
COMMAND ADDRESS

SINGLE-CHIP FLASH-MEMORY DEVICE USING SERIAL COMMAND, ADDRESS, AND DATA COMMUNCATIONS

BACKGROUND OF THE INVENTION

1. Field of the Invention

The present invention relates to a one-chip flash-memory device having a communications function, in which data can be rewritten into the memory array, or the contents of the memory array can be erased, as well as read out, by a writing, erasing or reading mechanism disposed outside or inside the flash-memory device without dismounting the flash-memory device from a system such as a copier or the like.

2. Description of the Prior Art

When it is necessary to rewrite data into a prior art flash memory or erase a data in the flash memory, an electronics technician must dismount the memory chip from circuit board of a system and then carry it into a service center or the like. After he or she has rewritten data into the flash memory or erased the contents of the memory by means of a ROM writer (or PROM programmer), he or she must mount the memory chip on the circuit board in the system again. That's because this rewriting and erasing process for flash memories follows the process, which was made popular before the advent of flash memories, for a memory the contents of which are generally erased by exposure to ultraviolet radiation, such as an EPROM or the like. That is, since the contents of such a memory must be changed or erased by irradiation with ultraviolet light, the memory chip needs to be dismounted from a circuit board in a system for changing or erasing data in the memory. The advent of flash memories did not change the situation in which the same rewriting or erasing process as for a memory the contents of which are generally erased by exposure to ultraviolet radiation, such as an EPROM or the like, has been applied to flash memories, as mentioned above. That is, a flash memory chip is dismounted from a circuit board for altering or erasing data in the flash memory chip.

In general, the contents of a flash memory are electrically altered or erased by means of a ROM writer, as previously mentioned. Therefore, the desire to change or erase the contents of a flash memory built in a circuit board of a system, such as a copier or the like, without dismounting the memory chip from the circuit board has grown. This demand is great when it is necessary to change the contents of a flash memory after shipment of a system having a built-in memory to a customer's site. The important challenge to such rewriting and erasing processes for a flash memory mounted on a circuit board of a system is to change and erase data in the built-in flash memory efficiently. To this end, the inventors had hit upon the idea of making improvements to a circuit board on which a flash memory is to be mounted so as to apply data, an address, and a control signal to pins of the circuit board, as shown in FIGS. 8 and 9.

FIG. 8 shows a block diagram of prior art system having a flash-memory chip mounted on a circuit board for changing, erasing and reading out data in the flash memory without the use of communications lines, which was devised by the inventors of the present invention. In the figure, reference character FM1 denotes a conventional flash-memory chip mounted on a circuit board in a system. S1, S2, . . . , and Sn denote signal lines connected to input/output pins of the flash-memory chip FM1, respectively. BS denotes a bus selector for selectively connecting the signal lines S1, S2, . . . , and Sn to either the CPU or the connector C for receiving and delivering data, an address, and a control signal applied thereto from outside the system SYS. CS1, CS2, . . . , and CSn denote signal lines connected between the bus selector BS and the connector C, and CP1, CP2, . . . , and CPn denote signal lines through which information is read out of the flash-memory by the CPU under normal operation of the system.

Next, the description will be directed to the operation of the system. When data stored in the flash-memory chip FM1 is altered or the contents of the memory chip are erased, the bus selector BS selects the signal lines CS1, CS2, . . . , and CSn. Data, an address, and a control signal are supplied to the pins of the flash-memory chip FM1 from outside the system by way of the signal lines CS1, CS2, . . . , and CSn and S1, S2, . . . , and Sn, respectively.

Under normal conditions of the system when data is read out of the flash-memory chip FM1, the bus selector BS selects the signal lines CP1, CP2, . . . , and CPn. Then, the CPU (not shown in the figure) reads out data from the flash-memory chip FM1 by way of the signal lines S1, S2, . . . , and Sn and CP1, CP2, . . . , and CPn. In this case, the bus selector BS isolates the flash-memory chip FM1 from outside the system because it does not select the signal lines CS1, CS2, . . . , and CSn.

Referring now to FIG. 9, it illustrates a block diagram of another system having flash-memory chip mounted on a circuit board for changing, erasing and reading out a data in the flash memory without the use of communications lines, which was devised by the inventors of the present invention. In the figure, reference character FM2 denotes a conventional flash-memory chip mounted on a circuit board in a system. S1, S2, . . . , and Sn denote signal lines connected to input/output pins of the flash-memory chip FM2, respectively. BS denotes a bus selector for selectively connecting the signal lines S1, S2, . . . , and Sn to either the CPU or the buffer BU for buffering parallel data obtained by the serial-parallel converter SP for converting serial data including serial communications data, i.e., an address, a command, and a data into a parallel data, and for delivering the parallel data, the address, and the control signal to the flash-memory. CS1, CS2, . . . , and CSn denote signal lines connected between the bus selector BS and the buffer BU. B1, B2, . . . , and Bn denote signal lines connected between the serial-parallel converter SP and the buffer BU, and CP1, CP2, . . . , and CPn denote signal lines through which information is read out of the flash-memory FM2 by the CPU under normal operations of the system.

Next, the description will be directed to the operation of the system. When data stored in the flash-memory chip FM2 is altered or the contents of the memory chip are erased, the bus selector BS selects the signal lines CS1, CS2, . . . , and CSn. Serial data including an address, a command, and data is supplied to the serial-parallel converter SP from outside the system and then it is converted into a parallel data by the converter SP. The parallel data is transferred to the buffer BU by way of the signal lines B1, B2, . . . , and B and then it is buffered in the buffer BU. The bus selector BS is switched so that the flash memory is electrically connected with a device disposed outside of the system. The flash-memory chip FM2 is isolated from the internal circuits of the system. In this condition, the address and command required for controlling the flash-memory chip FM2 are supplied to the pins of the flash-memory chip FM2 from the buffer BU by way of the signal lines CS1, CS2, . . . , and CSn and S1, S2, . . . , and Sn, respectively, after all the parallel data have been buffered in the buffer BU.

Under normal conditions of the system when data is read out of the flash-memory chip FM2, the bus selector BS selects the signal lines CP1, CP2, ..., and CPn. Then, the CPU (not shown in the figure) reads out data from the flash-memory chip FM2 by way of the signal lines S1, S2, ..., and Sn and CP1, CP2, ..., and CPn. In this case, the bus selector BS isolates the flash-memory chip FM2 from outside the system because it does not select the signal lines CS1, CS2, ..., and CSn.

In order to alter or erase the contents of such the prior art flash-memory chip built in the system, it is necessary to dismount the flash-memory chip from a circuit board of the system and then mount the memory chip, the contents of which has been altered or erased, on the circuit board. Therefore, a problem ensues in that it takes a long time to alter or erase the contents of the prior art flash memory since the rewriting and erasing operations are complicated.

Furthermore, the example of the system shown in FIG. 8 needs a number of signals lines, the connector and bus selector, which are built on the circuit board, as well as the flash-memory chip, in order to change, erase and read out data stored in the flash-memory chip. Therefore, another problem ensues in that the area of the circuit board with the on-board flash memory is increased and hence the size of the whole system is increased. Similarly, the example of the system shown in FIG. 9 needs the serial-parallel converter for converting serial data delivered from outside the circuit board to the on-board flash memory into parallel data, a number of signal lines, the buffer, and the bus selector in order to change, erase and read out data stored in the flash-memory chip. Therefore, the example of FIG. 9 encounters the same problem that the area of the circuit board with the on-board flash memory is increased and hence the size of the whole system is undesirably increased.

SUMMARY OF THE INVENTION

It is therefore an object of the present invention to provide a one-chip flash-memory device in which a communication function, supporting communication between a device disposed outside a system including the flash-memory chip and the flash-memory chip, and a function of controlling rewriting, erasing and reading operations for the flash-memory chip are disposed together with the flash-memory array, and in which new data can be rewritten into the flash-memory array or the contents of the flash-memory array can be erased by a writing or erasing mechanism disposed inside or outside the system without dismounting the memory chip from a circuit board, thereby reducing the area of the circuit board on which the memory chip is mounted.

In accordance with the present invention, there is provided a one-chip flash-memory device comprising a flash-memory array, a communications unit for analyzing a serial signal applied thereto from outside the device and for resolving the serial signal into an address, a command, and a data in parallel with each other, and a control unit for controlling rewriting, erasing, and reading operations which are performed for said flash-memory array in accordance with the address, command, and data obtained by the communications unit. The electrical wiring and circuits for performing rewriting, erasing and reading operations for the flash-memory array are arranged in the one-chip flash-memory device.

In operation, the one-chip flash-memory device resolves a serial signal applied thereto from outside the device into an address, a command and a data, and controls rewriting, erasing, and reading operations which are performed for the flash-memory array in accordance with the address, command, and data. Therefore, rewriting and erasing operations can be performed without dismounting the memory chip according to the present invention from a circuit board. Additionally, the area of a circuit board on which the flash-memory chip according to the present invention is mounted can be reduced.

Preferably, the communications unit comprises a protocol analyzer for determining whether or not predetermined continuous bits of the serial signal, which the device has received from outside the device, correspond to a predetermined protocol showing the start of communications, and for passing the serial signal therethrough if it detects the predetermined protocol showing the start of communications in the serial signal. Since the one-chip flash-memory device captures the serial signal after it has determined whether or not the serial signal includes the protocol showing the start of communications, the flash-memory chip is all that is needed to receive the serial signal from outside the memory chip.

The communications unit further comprises an input register for storing the serial signal passing through the protocol analyzer, a command latch for reading out the command from the input register in parallel and for storing the command, an address latch for reading out the address in parallel from the input register and for storing the address, and a data latch for reading out the data from the input register in parallel and for storing the data, and wherein the control unit comprises a timing generator, in accordance with a clock signal and the command stored in the command latch, for generating a control signal to control an output timing of the address and data latches for a rewriting or erasing operation, a rewrite and erase timer and control circuit, responsive to the control signal from the timing generator, for applying control signals including a rewrite enable signal to the flash-memory array, and a rewrite and erase pulse generator for applying a rewrite or erase pulse to the flash-memory array under a control of the rewrite and erase timer and control circuit. After the one-chip flash-memory device has resolved a serial signal applied thereto from outside the device into an address, a command and a data in parallel with each other, the device latches them respectively and the timing generator controls the latch circuits, rewrite and erase control circuit and rewrite and erase pulse generator for a rewriting or erasing operation. Therefore, the flash-memory chip is all that is needed to perform a rewriting or erasing operation based on a serial signal applied thereto from outside the memory chip. Additionally, no serial-parallel converter or the like needs to be disposed on a circuit board together with the flash-memory chip of the present invention.

Preferably, the one-chip flash-memory device further comprises a sense amplifier circuit for amplifying parallel data read out the flash-memory array, an output register for storing the parallel data output by the sense amplifier circuit, and an output circuit for sending out the data stored in the output register serially in response to a reading command generated by the control unit. Therefore, data read out of the flash-memory array can be delivered serially to outside the one-chip flash-memory device.

The one-chip flash-memory device further comprises a bus selector, responsive to a selection signal applied thereto, for selectively routing data read out of the output circuit to either a system including the one-chip flash memory device or outside the system. Furthermore, since the bus selector selectively routes data read out of the output circuit to either a system including the one-chip flash memory device or outside the system, the one-chip flash-memory device selectively can deliver data to either inside the system in which the memory chip is located or outside the system.

Preferably, the communications unit further comprises a clock input pin for receiving a clock signal as a basis of the one-chip flash-memory device, an external serial signal input pin for receiving a serial signal from outside the system, an internal serial signal input pin for receiving a serial signal from the system, an external serial signal output pin for delivering a serial signal to outside the system by way of the bus selector, and an internal serial signal output pin for delivering a serial signal to the system by way of the bus selector. Therefore, a serial signal can be input or output into or from the system.

Preferably, the communications unit further comprises a clock input pin for receiving a clock signal as a basis of the one-chip flash-memory device, an external serial signal input pin for receiving a serial signal from outside the system, an internal serial signal input pin for receiving a parallel signal from the system, an external serial signal output pin for delivering a serial signal to outside the system by way of the bus selector, and an internal serial signal output pin for delivering a parallel signal to the system by way of the bus selector. Therefore, a parallel signal can be input or output into or from the system.

Further objects and advantages of the present invention will be apparent from the following description of the preferred embodiments of the invention as illustrated in the accompanying drawings.

BRIEF DESCRIPTION OF THE DRAWINGS

FIG. 1 is a block diagram of a one-chip flash-memory device with a communications function according to a first embodiment of the present invention;

FIGS. 2(a), 2(b), and 2(c) are time charts for showing examples of serial signals applied to the external serial signal input pin in the one-chip flash-memory device of FIG. 1;

DETAILED DESCRIPTION OF THE PREFERRED EMBODIMENTS

Figure 3:
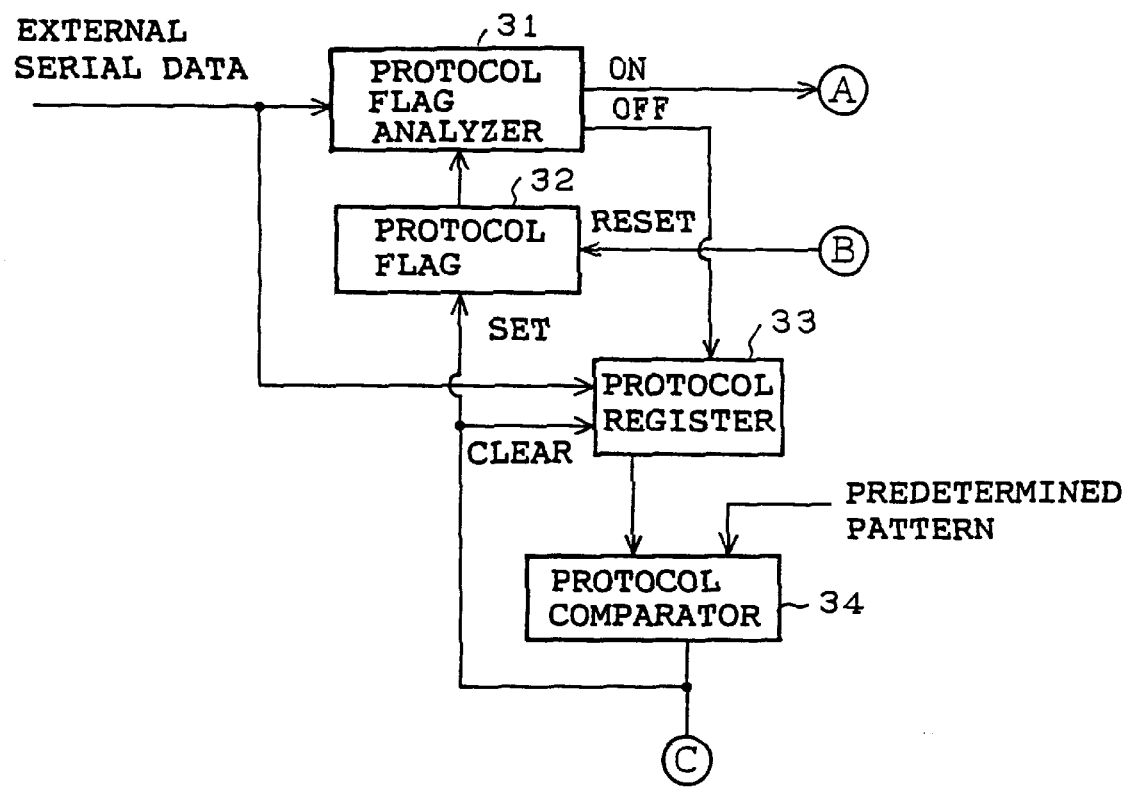
FIG. 3 is a block diagram showing an example of the protocol analyzer in the one-chip flash-memory device of FIG. 1.

Referring now to FIG. 1, it illustrates a block diagram of a one-chip flash-memory device with a communications function according to the first embodiment of the present invention. In the figure, reference numeral 1 denotes a clock input pin to which a clock signal, which serves as a basis, i.e., a pacemaker of the memory device, is applied. Reference numeral 2 denotes a clock generator for generating another clock signal which is to be used within the memory chip in accordance with the clock signal input through the clock input pin 1, 3 denotes a reset input pin through which a reset signal for resetting the memory chip is input into the memory chip, and 4 denotes a serial signal input pin through which a serial signal including an address, a command, and data delivered from outside a system, such as a copier or the like, in which the one-chip flash-memory device is disposed, is input into the memory device. Reference numeral 5 denotes a protocol analyzer for determining whether or not predetermined continuous bits of the received serial signal correspond to a predetermined protocol showing the start of communications in order to receive the serial signal from outside the system by use of a communications line connected between the system including the one-chip flash-memory chip of this embodiment and a device disposed outside the system. The protocol analyzer 5 passes the serial signal therethrough if it detects the predetermined protocol showing the start of communications in the serial signal. Furthermore, reference numeral 6 denotes an input register for converting the serial signal passing through the protocol analyzer 5 into a corresponding parallel signal and for storing the parallel signal, 7 denotes a command latch for reading out the command from the input register 6 in parallel and for latching the command, 8 denotes a timing generator for generating a timing signal to control timing between the circuits disposed in the chip, 9 denotes an internal serial signal input pin for receiving a serial signal from inside the system, 10 denotes a data latch for reading out the parallel signal from the input register 6 and for latching the parallel signal, 11 denotes an address latch and decoder for reading out the address in parallel from the input register 6 and for latching and decoding the address, and 12 denotes a flash-memory array for storing data. Reference numeral 14 denotes a rewrite and erase timer and control circuit for controlling rewriting or erasing timing in response to the command timed by the timing generator 8, 15 denotes a ready/busy pin through which a signal informing that the chip is ready or busy is delivered outside of the device, 16 denotes a rewrite and erase pulse generator for generating a rewrite or erase pulse, 17 denotes a sense amplifier circuit for amplifying a small signal current generated by the flash-memory array 12, 18 denotes an output register for converting the parallel signal output by the sense amplifier circuit 17 into a corresponding serial signal, 19 denotes an output circuit for sending out the serial signal in response to a timing signal generated by the timing generator 8, 20 denotes a Vcc power pin with the potential Vcc, 21 denotes a Vss power pin with the potential Vss, 22 denotes an internal serial signal output pin for delivering the serial signal inside of the system, 23 denotes an external serial signal output pin for delivering the serial signal outside the system, 24 denotes a bus selector for selectively connecting the output of the output circuit 19 with either the internal serial signal output pin 22 or the external serial signal output pin 23, and 25 denotes a bus selector control input pin through which a control signal is applied for controlling the bus selector 24. All of these components are disposed in the one-chip flash-memory device.

Referring now to FIGS. 2(a), 2(b), and 2(c), they are time charts showing examples of serial signal applied to the external serial signal input pin 4 when new data is written into the flash-memory array 12, the contents of the flash memory is erased, and data is read out of the flash memory, respectively. In these figures, a protocol indicating the start of communications is designated by a set of reference characters P1, . . . , and Pn, a command is designated by a set of reference characters C1, . . . , and Cx, an address is designated by a set of reference characters A1, . . . , and Ay, and data is designated by a set of reference characters D1, . . . , and Dz. As shown in FIG. 2(a), the protocol indicating the start of communications, a command, an address, and data are input in sequence when writing a new data into the flash memory. As shown in FIG. 2(b), the protocol indicating the start of communications and a command, but not addresses and data, are input in sequence because all the addresses are erased by one operation when erasing the contents of the flash memory. As shown in FIG. 2(c), the protocol indicating the start of communications, a command, and an address, but not data are input in sequence when reading out data from the flash memory.

FIG. 3 is a block diagram showing an example of the protocol analyzer 5 shown in FIG. 1. In the figure, reference numeral 31 denotes a protocol flag analyzer for determining whether a protocol flag 32, which is set to the on state when the one-chip flash-memory device receives the protocol indicating the start of communications, is in the on or off state and for passing an external serial signal delivered from outside the system if the protocol flag is in the on state, 33 denotes a protocol register for storing the external serial signal if the protocol flag is in the on state, and 34 denotes a protocol comparator for setting the protocol flag 32 to the on state when the serial signal stored in the protocol register 33 is equivalent to the predetermined pattern of the protocol indicating the start of communications. Upon setting the protocol flag 32 to the on state, the protocol comparator 34 erases the contents of the protocol register 33 and resets the counter 41, which will be described with reference to FIG. 4, disposed in the input register 6.

Figure 4:
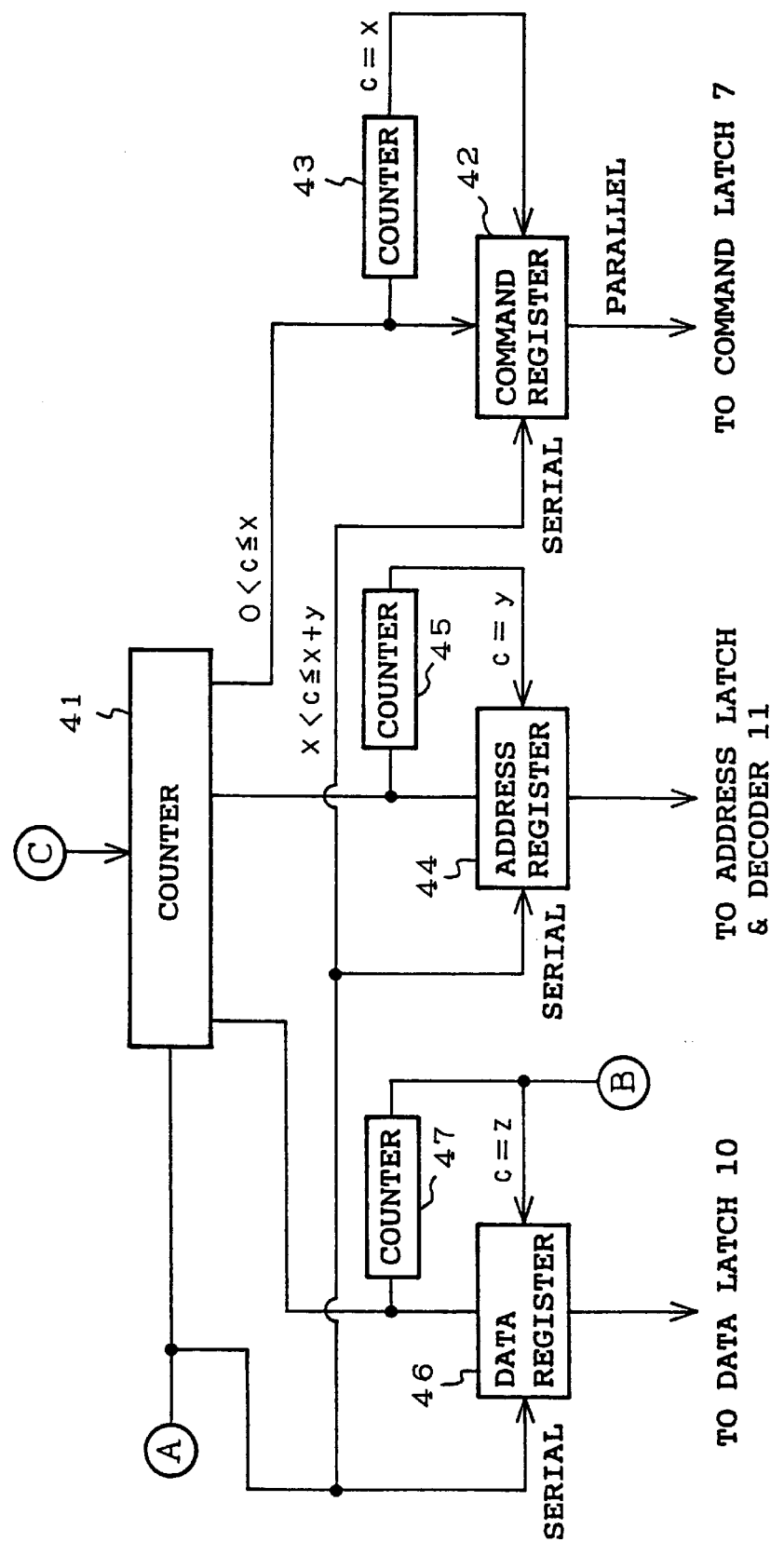
FIG. 4 is a block diagram showing an example of the input register in the one-chip flash-memory device of FIG. 1.

FIG. 4 is a block diagram showing an example of the input register 6 shown in FIG. 1. In the figure, reference numeral 41 denotes a counter which counts bit by bit the number of bits of the external serial signal passing through the protocol flag analyzer 31 shown in FIG. 3 and which is reset when the protocol comparator 34 shown in FIG. 3 determines that the device has received the protocol showing the start of communications, 42 denotes a command register for storing the external serial signal serially when the count value C is greater than 0 and smaller than or equal to a predetermined number x, 43 denotes a counter for enabling parallel output of the command register 42 when the number of bits of a data input into the command register 42 reaches the predetermined number x, 44 denotes an address register for storing the external serial signal serially when the count value C is greater than the predetermined number x and smaller than or equal to a predetermined number (x+y), 45 denotes a counter for enabling the parallel output of the address register 44 when the number of bits of a data input into the address register 44 reaches predetermined number y, 46 denotes a data register for storing the external serial signal serially when the count value C is greater than the predetermined number (x+y) and smaller than or equal to a predetermined number (x+y+z), and 47 denotes a counter for enabling parallel output of the data register 46 and for resetting the protocol flag shown in FIG. 3 when the number of bits of data input into the data register 46 reaches a predetermined number z.

Figure 5:
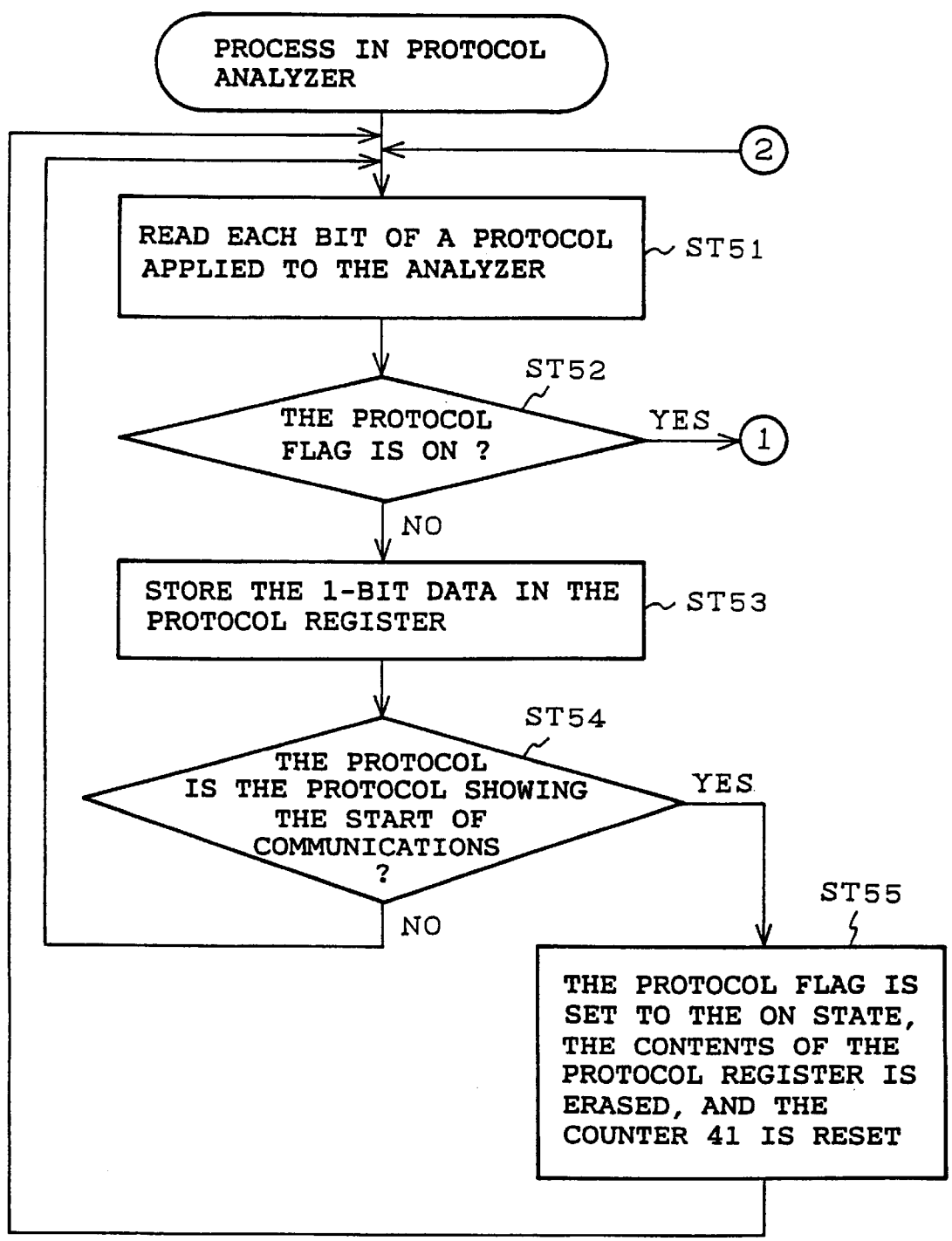
FIG. 5 is a flow diagram showing the operation of the protocol analyzer shown in FIG. 3.
Figure 6:
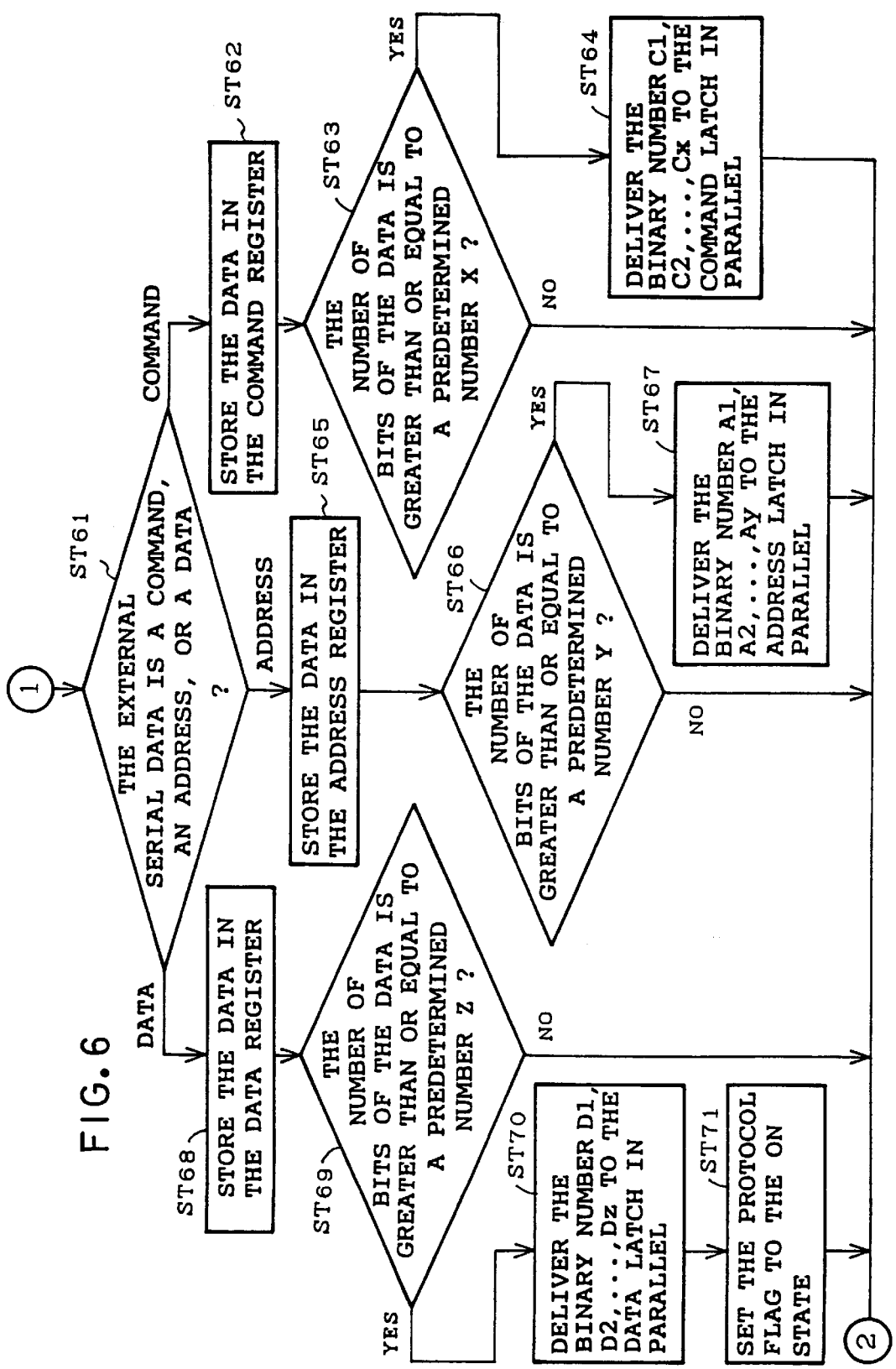
FIG. 6 is a flow diagram showing the operation of the input register shown in FIG. 4.

Next, the description will be directed to the operation of the device of this embodiment. FIG. 5 is a flow diagram showing the operation of the protocol analyzer 5 shown in FIG. 3, and FIG. 6 is a flow diagram showing the operation of the input register 6 shown in FIG. 4. First, the operation of rewriting the contents of the flash-memory array 12 using the communications line connected between the one-chip flash-memory device and the system including the device will be explained. When a serial signal as shown in FIG. 2(a) is input into the external serial signal input pin 4 from outside the system for rewriting data into the flash memory, the protocol flag analyzer 31 in the protocol analyzer 5, in step ST 52, checks the protocol flag as the protocol analyzer 5 reads each bit of a binary data signal such as a protocol, data, or the like applied thereto in step ST51. If the protocol flag is not in the on state, the protocol analyzer 5, in step ST53, stores the bit of the binary data, which the analyzer has received in step ST51, in the protocol register 33. Then, the protocol analyzer 5 advances to step ST54 wherein it determines whether or not the contents of the protocol register 33 are equivalent to the predetermined pattern of the protocol indicating the start of communications. Then, the protocol analyzer 5 returns to step ST51 wherein it reads out the next bit of the binary data unless it detects the protocol indicating the start of communications. In the latter case, the protocol analyzer 5 advances to step ST55 where it sets the protocol flag to the on state, erases the contents of the protocol register 33, resets the counter 41 shown in FIG. 4, and returns to step ST51 in preparation for receiving the next protocol indicating the start of communications if it determines that the binary data corresponds to the protocol indicating the start of communications. In performing step ST52, if the protocol flag is in the on state, the binary data input into the one-chip flash-memory device is passed through the protocol analyzer 5 and then is further input into the input register 6.

As shown in FIG. 6, the one-chip flash-memory device, in step ST61, determines which category, i.e., command, address, or signal, the external serial data passing through the protocol flag analyzer 31 of FIG. 3 belongs to. The determination is made on the basis of the count value C obtained by the counter 41. The counter 41 counts bit by bit the number of bits of the external serial signal. If the count value C is greater than 0 and smaller than or equal to the predetermined value x, the one-chip flash-memory device determines that the external serial signal is a command and, in step ST62, stores the external serial signal in the command register 42. If the count value C is greater than the value x and smaller than or equal to the predetermined value (x+y), the device determines that the external serial signal is an address and, in step ST65, stores the external serial signal in the address register 44. If the count value C is greater than the value (x+y) and smaller than or equal to the predetermined value (x+y+z), the device determines that the external serial data is signal and, in step ST68, stores the external serial signal in the data register 46.

The counter 43, in step ST63, counts the number of bits of the command which is being stored in the command register 42, and, in step ST64, delivers a signal for enabling the command register 42 to output its contents in parallel to the command latch 7 when the counter 43 reaches the count value x.

The counter 45, in step ST66, counts the number of bits of the address which is being stored in the address register 44, and, in step ST67, delivers a signal for enabling the address register 44 to output its contents in parallel to the address latch and decoder 11 when the counter 45 reaches the count value y.

The counter 47, in step ST69, counts the number of bits of the data which is being stored in the data register 46, and, in step ST70, delivers a signal for enabling the data register 46 to output its contents in parallel to the data latch 10 when the counter 47 reaches the count value z. The one-chip flash-memory device advances to step ST71 wherein it sets the protocol flag 32 shown in FIG. 3 to the on state when the z-bit data is stored in the data register 46 and then returns to step ST51 wherein it receives the next bit of the external serial data. Thus, the command, address and data are stored in the command latch 7, address latch and decoder 11, and data latch 10, respectively.

The remainder of the rewriting operation is similar to that for the prior art flash memory mentioned above, and therefore detailed description of the operation will be omitted. Briefly, the timing generator 8 receives a basic clock from the clock generator 2 and the command from the command latch 7 and controls the output timing of the command latch 7, address latch and decoder 11, and data latch 10. Furthermore, the timing generator 8 delivers a control signal which corresponds to the command to the rewrite and erase timer and control circuit 14. The rewrite and erase timer and control circuit 14 sends out control signals such as a rewrite enable signal generated under a needed timing control and the like to the flash-memory array 12 in response to the control signal generated by the timing generator 8, and then the circuit 14 activates the rewrite and erase pulse generator 16. The rewrite and erase pulse generator 16 applies high voltages required for the rewriting operation to all the cells of the flash-memory array 12 in response to the start instruction. Then, an address is delivered to the flash-memory array 12 from the address latch and decoder 11 under the control of the timing generator 8, and after that data is delivered from the data latch 10 and then is rewritten into the flash-memory array 12. In this manner, the rewriting operation is completed.

Next, the description will be directed to the erasing operation by use of the communications line. When the contents of the flash-memory array are erased, a serial signal as shown in FIG. 2(b) is applied to the one-chip flash-memory device from outside the system including the device. The serial signal includes no address since the contents of the flash-memory array 12 at all the addresses are erased in one operation. Since the operation of the protocol analyzer 5 is the same as in the aforementioned rewriting operation, duplicate description will be omitted. In the input register 6, the serial signal is stored in only the command register 42 shown in FIG. 4, whereas no data is stored in the address register 44 and data register 46. Therefore, only the command latch 7 of FIG. 1 latches the command, whereas the address latch and decoder 11 and data latch 10 remain empty. Since the remainder of the operation of the input register 6 is the same as in the aforementioned rewriting operation, duplicate description will be omitted.

Next, the description will be directed to the operation of getting access to data stored in the flash-memory array 12 from outside the system including the one-chip flash-memory device, using the communications line. In this case, a selection signal is input into the one-chip flash-memory device through the bus selection input pin 25 in order to connect the output of the bus selector 24 with the external serial data output pin 23 for delivering a serial signal outside of the system including the flash-memory chip. Then, a serial signal is input into the flash-memory chip through the external serial signal input pin 4. The serial signal is composed of the protocol showing the start of communications, a command and an address, as shown in FIG. 2(c). It is a matter of course that the serial signal includes no data. Since the operation of the protocol analyzer 5 is the same as in the aforementioned rewriting operation, duplicate description will be omitted. In the input register 6, the serial signal is stored only in the command register 42 and address register 44 shown in FIG. 4, whereas no data is stored in the data register 46. Therefore, the command latch 7 of FIG. 1 latches the command and the address latch and decoder 11 latches the address, whereas the data latch 10 remains empty. The timing generator 8 receives a basic clock from the clock generator 2 and the command from the command latch 7 and then controls the output timing of the command latch 7 and address latch and decoder 11. When the address is applied to the flash-memory array 12, corresponding data is read out of the flash-memory array 12. Then, the data is amplified by the sense amplifier circuit 17 and is passed through the output register 18, output circuit 19, and bus selector 24. Finally, the data is read out of the one-chip flash-memory device through the second serial signal output pin 23 and then is delivered outside of the system. During this reading operation, the rewrite and erase timer and control circuit 14 and rewrite and erase pulse generator 16 are not activated.

When the system including the flash-memory chip provides the flash-memory device with a serial signal to rewrite data into the flash memory or erase the contents of the flash memory, the serial signal is directly input to the input register 6 by way of the internal serial signal input pin 9, not through the protocol analyzer 5. Since the remainder of the rewriting or erasing operation in this case is the same as in the case of receiving a serial signal by way of the external serial signal input pin 4 electrically connected to outside the system by way of the communications line, duplicate description will be omitted.

When the system including the flash-memory chip reads out a serial signal from the one-chip flash-memory device, the system only applies a selection signal to select the internal output of the bus selector 24 to the bus selector pin 25. Since the remainder of the reading operation in this case is the same as in the case of reading out a serial signal present at the external serial signal output pin electrically connected to outside the system by way of the communications line, duplicate description will be omitted.

Figure 7:
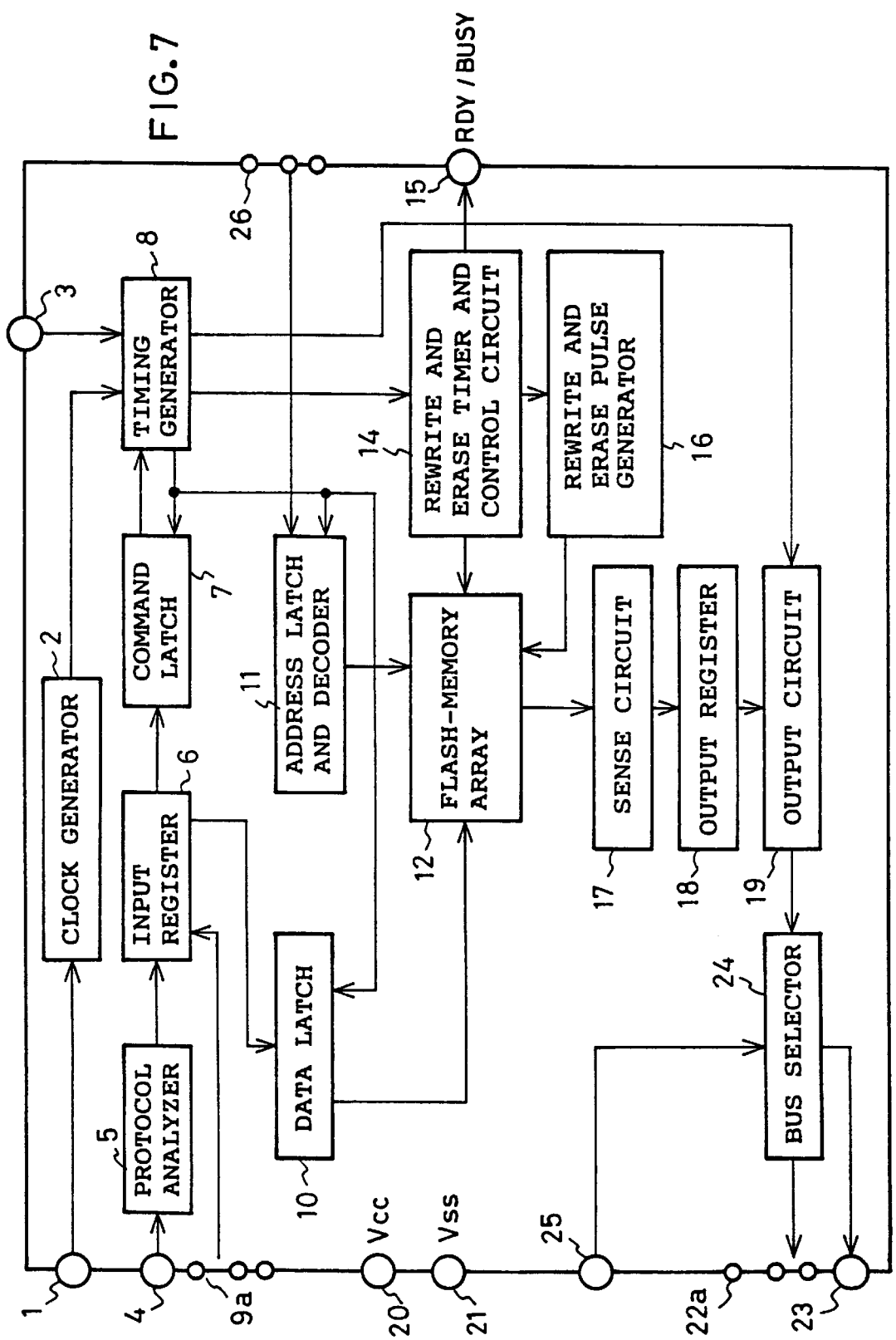
FIG. 7 is a block diagram of one-chip flash-memory device according to a second embodiment of the present invention.
Figure 8:
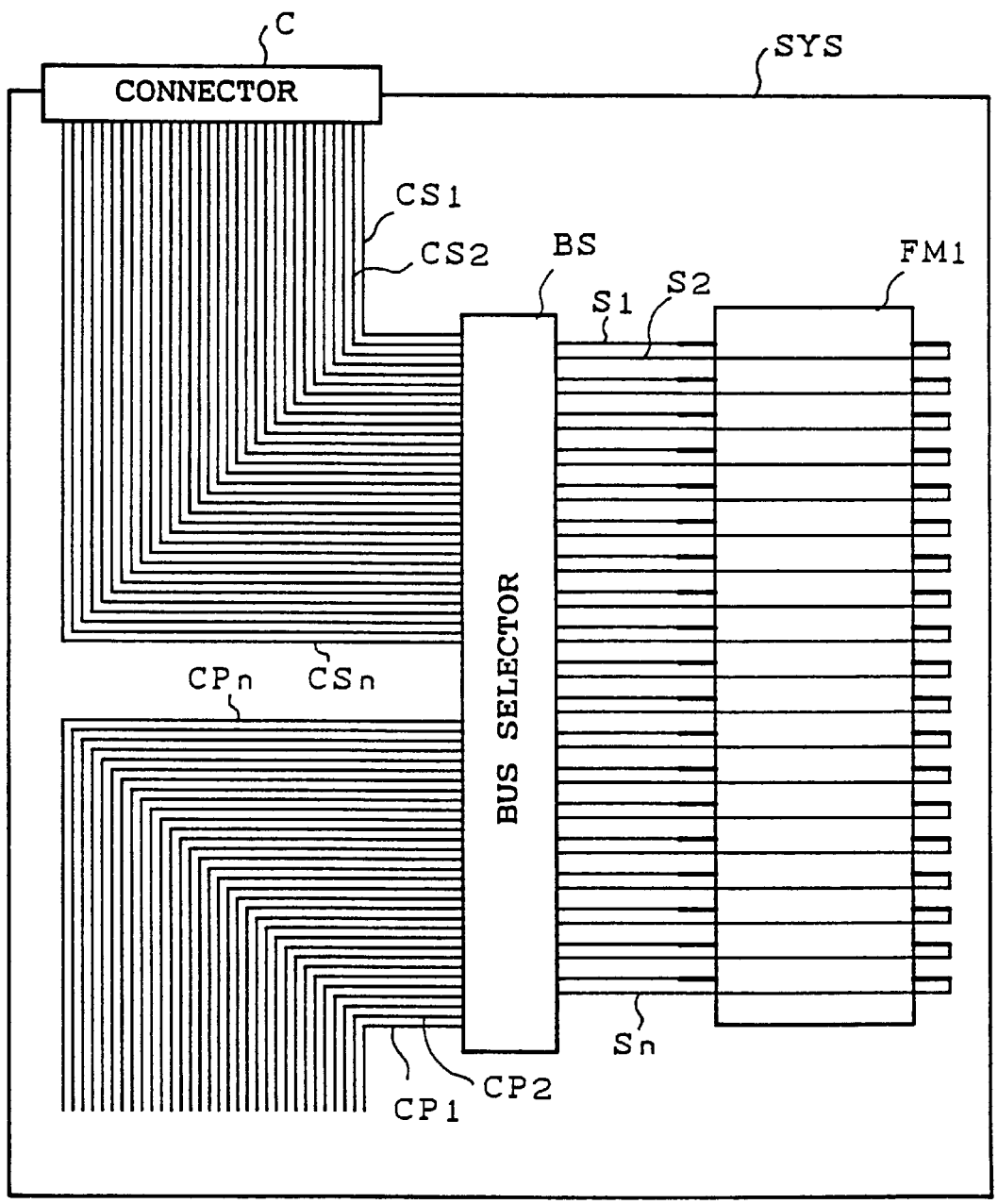
FIG. 8 is a block diagram of a prior art system having a flash-memory chip mounted on a circuit board for changing, erasing and reading out data in the flash memory without the use of communications lines, which was devised by the inventors of the present invention.
Figure 9:
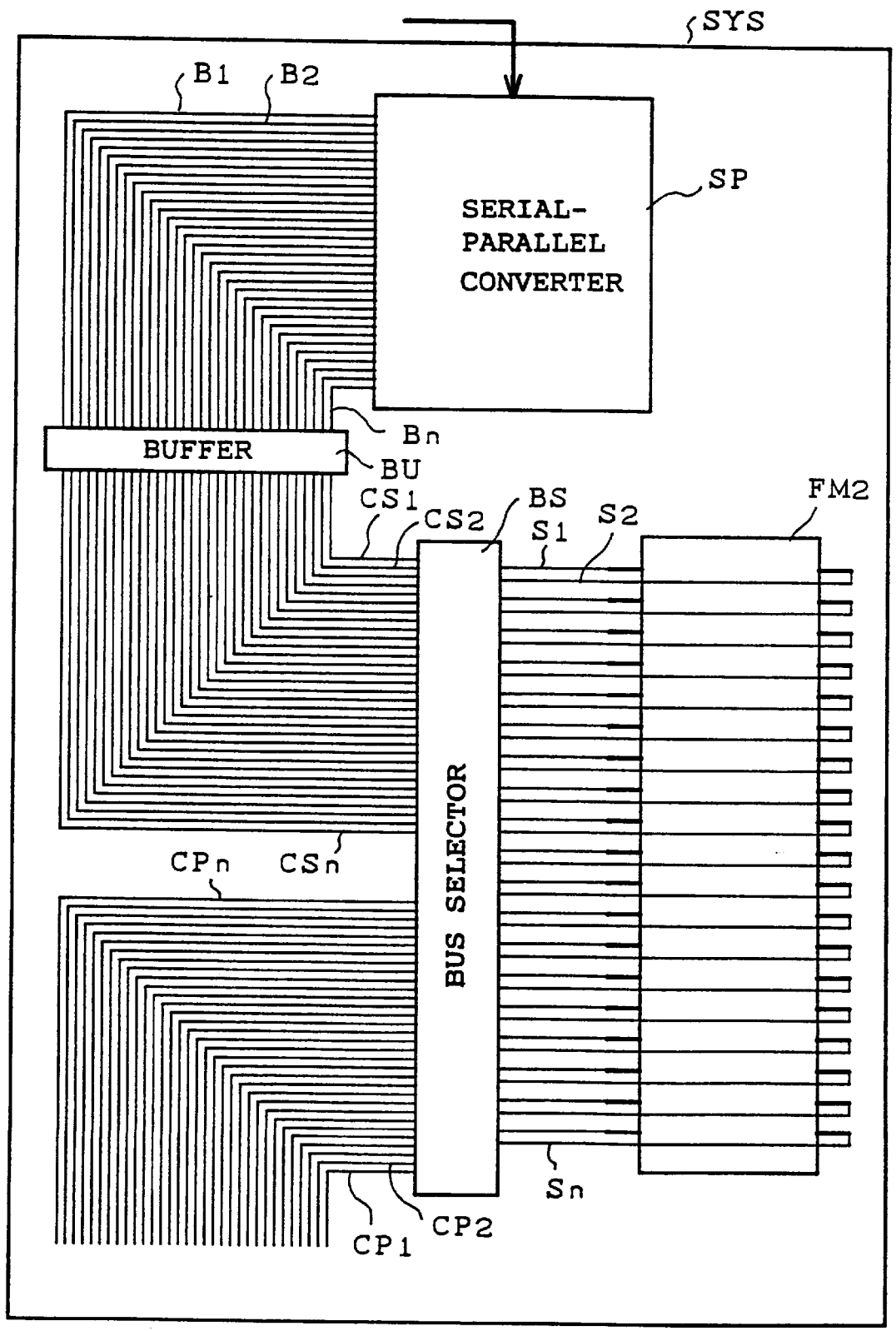
FIG. 9 is a block diagram of another system having a flash-memory chip mounted on a circuit board for changing, erasing and reading out data in the flash memory without the use of communications lines, which was devised by the inventors of the present invention.

Referring now to FIG. 7, it illustrates a block diagram of one-chip flash-memory device according to a second embodiment of the present invention. In the figure, like elements are designated by the same reference numerals as in FIG. 1. Therefore, duplicate description of the same elements will be omitted. The differences between the first embodiment of FIG. 1 and the second embodiment of FIG. 7 are that the one-chip flash-memory device of FIG. 7 is adapted to receive a parallel signal from inside the system including the device and deliver a parallel signal to inside the system. In FIG. 7, reference numeral 9a denotes an internal parallel signal input pin, 22a denotes an internal parallel signal output pin, and 26 denotes an internal parallel address input pin.

Next, the description will be directed to the operation of the one-chip flash-memory device of the second embodiment. The rewriting, erasing, and reading operations for a serial signal input through the external serial signal input pin 4 are the same as in the first embodiment, and therefore duplicate description will be omitted.

When a parallel signal is input into the one-chip flash-memory device by way of the internal parallel signal input pins 9a to rewrite the data into the flash-memory or erase the contents of the flash-memory, the parallel signal is input into the input register 6 in parallel. A plurality of bits, e.g., x bits at the high end of the parallel signal is a command and a plurality of bits, e.g., z bits at the low end of the parallel signal are data. The x-bit command at the high end of the parallel signal is delivered to the command latch 7, and the z-bit data at the low end of the parallel data is delivered to the signal register 10. On the other hand, y-bit parallel address signals are input into the internal parallel address input pins 26 and then are latched in the address latch and decoder 11. The remainder of the rewriting or erasing operation is the same as in the first embodiment, and therefore duplicate description will be omitted.

When the system including the flash-memory chip reads out a parallel data by way of the internal parallel signal output pins 22a, the system only applies a selection signal to select the parallel signal output of the bus selector 24 to the bus selector pin 25 so that the memory chip outputs the parallel signal by way of the internal parallel signal output pins 22a.

As previously mentioned, the present invention offers the following advantageous effects.

The one-chip flash-memory device resolves a serial signal applied thereto from outside the device into an address, a command and data, and controls rewriting, erasing, and reading operations which are performed for the flash-memory array in accordance with the address, command, and data. Furthermore, the electrical wiring and circuits for performing rewriting, erasing and reading operations are arranged in the one-chip flash-memory device. Therefore, rewriting and erasing operations can be performed without dismounting the memory chip according to the present invention from a circuit board. Additionally, the area of a circuit board on which the flash-memory chip according to the present invention is mounted can be reduced.

Furthermore, since the one-chip flash-memory device captures a serial signal after it has determined whether or not the serial signal includes the protocol showing the start of communications, the flash-memory chip according to the present invention is all that is needed to receive a serial signal from outside the memory chip.

After the one-chip flash-memory device has resolved a serial signal applied thereto from outside the device into an address, a command and data in parallel with each other, the device latches them respectively and the timing generator controls the latch circuits, rewrite and erase control circuit, and rewrite and erase pulse generator for a rewriting or erasing operation. Therefore, the flash-memory chip according to the present invention is all that is needed to perform a rewriting or erasing operation based on a serial signal applied thereto from outside the memory chip. Additionally, no serial-parallel converter or the like needs to be disposed on a circuit board together with the flash-memory chip of the present invention.

Since the one-chip flash-memory device further comprises a sense amplifier circuit, output register for storing an output data amplified by the sense amplifier, and output circuit for serially outputting the data stored in the output register, data read out of the flash-memory array can be delivered outside the one-chip flash-memory device.

Furthermore, since the bus selector selectively routes a data read out of the output circuit to either a system including the one-chip flash memory device or outside the system, the one-chip flash-memory device can selectively deliver data to either inside the system in which the memory chip is located or outside the system.

Since the one-chip flash-memory device comprises a internal serial signal input pin for receiving a serial signal and an internal serial signal output pin for delivering a serial signal to inside the system, a serial signal can be input or output into or from the system.

Since the one-chip flash-memory device comprises an internal parallel signal input pin for receiving a parallel signal and internal parallel signal output pin for delivering a parallel signal inside the system, a parallel signal can be input or output into or from the system.

Many widely different embodiments of the present invention may be constructed without departing from the spirit and scope of the present invention. It should be understood that the present invention is not limited to the specific embodiments described in the specification, except as defined in the appended claims.

What is claimed is:

1. A one-chip flash-memory device comprising:

a flash-memory array;

communication means for analyzing a serial signal applied to said communication means from outside said device and for resolving the serial signal into an address, a command, and data in parallel with each other;

control means for controlling rewriting, erasing, and reading operations of said flash-memory array in accordance with the address, the command, and the data resolved by said communications means;

a sense amplifier circuit for amplifying the data read out from said flash-memory array;

an output register for storing the data output by said sense amplifier circuit;

an output circuit for outputting the data stored in said output register serially in response to a read command produced by said control means; and a bus selector, responsive to a selection signal applied to said bus selector, for selectively routing the data output from said output circuit to a system including said one-chip flash-memory device or outside of the system including said one-chip flash-memory device, said communications means comprising a clock input pin for receiving a clock signal, an external serial signal input pin for receiving the serial signal from outside the system, an internal serial signal input pin for receiving a parallel signal from within the system, an external serial signal output pin for delivering a serial signal outside the system through said bus selector, and an internal serial signal output pin for delivering a parallel signal to the system through said bus selector.

2. A one-chip flash-memory device comprising:

a flash-memory array;

communication means for analyzing a serial signal applied to said communication means from outside said device and for resolving the serial signal into an address, a command, and data in parallel with each other;

control means for controlling rewriting, erasing, and reading operations of said flash-memory array in accordance with the address, the command, and the data resolved by said communications means;

a protocol analyzer for determining whether a series of bits of the serial signal correspond to a protocol indicating initiation of communications and for passing the serial signal if said protocol analyzer detects the protocol indicating initiation of communications in the serial signal;

a sense amplifier circuit for amplifying the data read out from said flash-memory array;

an output register for storing the data output by said sense amplifier circuit;

an output circuit for outputting the data stored in said output register serially in response to a read command produced by said control means; and a bus selector, responsive to a selection signal applied to said bus selector, for selectively routing the data output from said output circuit to either a system including said one-chip flash-memory device or outside of the system including said one-chip flash-memory device, said communications means comprising a clock input pin for receiving a clock signal, an external serial signal input pin for receiving the serial signal from outside the system, an internal serial signal input pin for receiving a parallel signal from within the system, an external serial signal output pin for delivering a serial signal outside the system through said bus selector, and an internal serial signal output pin for delivering a parallel signal to the system through said bus selector.

3. A one-chip flash-memory device comprising:

a flash-memory array;

communication means for analyzing a serial signal applied to said communication means from outside said device and for resolving the serial signal into an address, a command, and data in parallel with each other;

control means for controlling rewriting, erasing, and reading operations of said flash-memory array in accordance with the address, the command, and the data resolved by said communications means;

a protocol analyzer for determining whether a series of bits of the serial signal correspond to a protocol indicating initiation of communications and for passing the serial signal if said protocol analyzer detects the protocol indicating initiation of communications in the serial signal, said communication means comprising:

an input register for storing a serial signal passed by said protocol analyzer, a command latch for reading the command from said input register in parallel and for storing the command, an address latch for reading the address in parallel from said input register and for storing the address, a data latch for reading the data from said input register in parallel and for storing the data, and said control means comprising:

a timing generator for generating a first control signal, in accordance with a clock signal and the command stored in said command latch, for controlling outputs from said address latch and said data latch for rewriting or erasing of said flash-memory array, a rewrite and erase timer and control circuit, responsive to the first control signal from said timing generator, for applying second control signals including a rewrite enable signal to said flash-memory array, and a rewrite and erase pulse generator controlled by said rewrite and erase timer and said control circuit, for applying a rewrite or erase pulse to said flash-memory array, and a bus selector, responsive to a selection signal applied to a selection signal applied to said bus selector, for selectively routing the data output from said output circuit to either a system including said one-chip flash-memory device or outside of the system including said one-chip flash-memory device, said communications means further comprising:

a clock input pin for receiving a clock signal, an external serial signal input pin for receiving the serial signal from outside the system, an internal serial signal input pin for receiving a parallel signal from within the system, an external serial signal output pin for delivering a serial signal outside the system through said bus selector, and an internal serial signal output pin for delivering a parallel signal to the system through said bus selector.

* * * * *

UNITED STATES PATENT AND TRADEMARK OFFICE
CERTIFICATE OF CORRECTION

PATENT NO. : 5,835,936
DATED : November 10, 1998
INVENTOR(S) : Tomioka et al.

It is certified that error appears in the above-identified patent and that said Letters Patent is hereby corrected as shown below:

On the title page, item [54], and Column 1, line 3;
       Change "COMMUNCATIONS" to --COMMUNICATIONS--.

Add

Item [73] Mitsubishi Electric Semiconductor Software
          Co., Ltd. and Mitsubishi Denki Kabushiki Kaisha
          Hyogo and Tokyo, Japan--.

Signed and Sealed this

Fourteenth Day of December, 1999

Attest:

Q. TODD DICKINSON

Attesting Officer

Acting Commissioner of Patents and Trademarks